United States Patent
Subbarao

(10) Patent No.: US 8,378,682 B2
(45) Date of Patent: Feb. 19, 2013

(54) FIELD IMAGE TOMOGRAPHY FOR MAGNETIC RESONANCE IMAGING

(76) Inventor: Muralidhara Subbarao, Stony Brook, NY (US)

( * ) Notice: Subject to any disclaimer, the term of this patent is extended or adjusted under 35 U.S.C. 154(b) by 577 days.

(21) Appl. No.: 12/658,001

(22) Filed: Feb. 1, 2010

(65) Prior Publication Data

US 2011/0115485 A1 May 19, 2011

Related U.S. Application Data

(60) Provisional application No. 61/281,397, filed on Nov. 17, 2009.

(51) Int. Cl.
*G01V 3/00* (2006.01)
(52) U.S. Cl. ......... 324/318; 324/322; 324/307; 324/309
(58) Field of Classification Search .......... 324/300–322; 600/407–435; 382/128–131
See application file for complete search history.

(56) References Cited

U.S. PATENT DOCUMENTS

| | | | |
|---|---|---|---|
| 4,968,937 A | 11/1990 | Akgun | |
| 6,476,606 B2 | 11/2002 | Lee | |
| 7,558,709 B2 | 7/2009 | Subbarao | |
| 7,577,309 B2 | 8/2009 | Subbarao | |
| 7,800,368 B2 * | 9/2010 | Vaughan et al. | 324/318 |
| 8,008,625 B2 * | 8/2011 | Subbarao | 250/362 |
| 2008/0129298 A1 * | 6/2008 | Vaughan et al. | 324/322 |
| 2011/0073763 A1 * | 3/2011 | Subbarao | 250/362 |
| 2011/0115485 A1 * | 5/2011 | Subbarao | 324/309 |

OTHER PUBLICATIONS

Muralidhara Subbarao, "Method and apparatus for high-sensitivity single-photon emission computed tomography", U.S. Appl. No. 12/586,863, filed Sep. 29, 2009. Pending Applcn.

* cited by examiner

*Primary Examiner* — Patrick Assouad
*Assistant Examiner* — Tiffany Fetzner

(57) ABSTRACT

Field Image Tomography (FIT) is a fundamental new theory for determining the three-dimensional (3D) spatial density distribution of field emitting sources. The field can be the intensity of any type of field including (i) Radio Frequency (RF) waves in Magnetic Resonance Imaging (MRI), (ii) Gamma radiation in SPECT/PET, and (iii) gravitational field of earth, moon, etc. FIT exploits the property that field intensity decreases with increasing radial distance from the field source and the field intensity distribution measured in an extended 3D volume space can be used to determine the 3D spatial density distribution of the emitting source elements. A method and apparatus are disclosed for MRI of target objects based on FIT. Spinning atomic nuclei of a target object in a magnetic field are excited by beaming a suitable Radio Frequency (RF) pulse. These excited nuclei emit RF radiation while returning to their normal state. The intensity or amplitude distribution of the RF emission field g is measured in a 3D volume space that may extend substantially along the radial direction around the emission source. g is related to the 3D tomography f through a system matrix H that depends on the MRI apparatus, and noise n through the vector equation g=Hf+n. This equation is solved to obtain the tomographic image f of the target object by a method that reduces the effect of noise.

20 Claims, 5 Drawing Sheets

Figure 1:
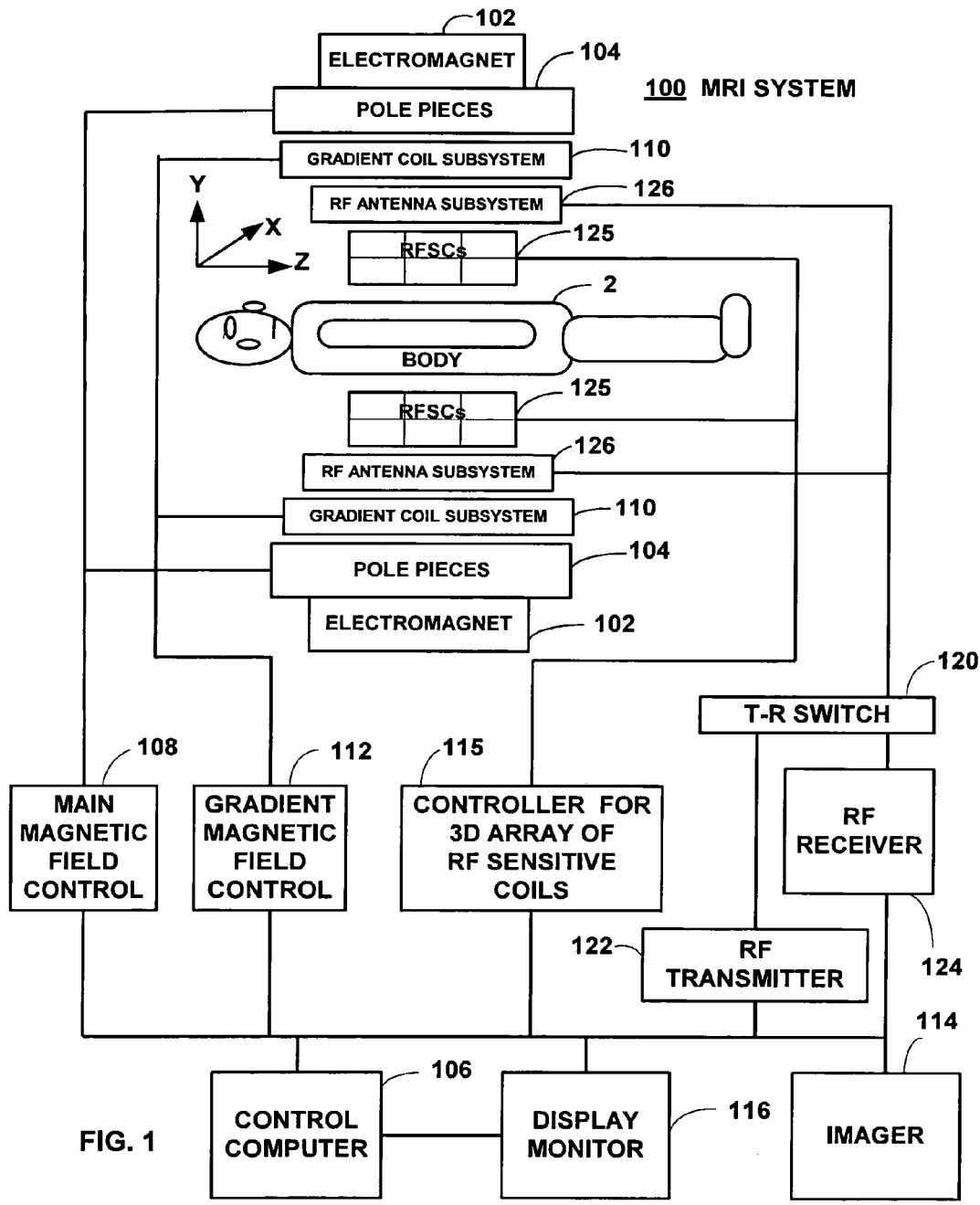

Select a 3D volume space V in the target object and beam a magnetic field B into the selected 3D volume space.

Send a suitable pulse sequence of Radio Frequency (RF) radiation into the selected 3D volume space V, and excite spinning nuclei of atoms of the target object present in the volume V to a higher energy state.

Measure a discretely sampled vector of values g of the RF emission field intensity (obtained after Fourier transforming the original time dependent signal) due to RF emission intensity f from the excited spinning nuclei in the 3D volume space V; measurement in this step is made at a discrete set of non-degenerate points in a 3D measurement volume space S near the target object; the 3D measurement volume space S may extend substantially along at least one radial direction pointing away from an approximate center of the 3D volume space V; measurement in this step is made using a plurality of RF sensitive coils (RFSCs).

Determine a system matrix H of values and formulate the equation g=Hf+n where n is an estimae of noise. Use the geometry of voxels and RFSCs and the radiation propogation property that it decreases with distance from the source.

$$g(x',y',z') = \sum_x \sum_y \sum_z H(x',y',z',x,y,z) f(x,y,z) + n(x',y',z')$$

$$\mathbf{g} = \mathbf{Hf} + \mathbf{n}$$

Solve the equation g=Hf+n for the desired quantity f by a method that reduces the effect of noise n significantly so that the desired goal of determining the spatial density distribution f of the RF emission source is achieved. Expectation maximization, regularization based on spectral filtering, etc. are some of the methods that reduce the effect of noise n.

FIG. 5. Method of the Invention

FIELD IMAGE TOMOGRAPHY FOR MAGNETIC RESONANCE IMAGING

This patent application is a continuation of the following US Provisional Application for Patent filed by this inventor:
M. Subbarao, "Field Image Tomography for Magnetic Resonance Imaging", U.S. Provisional Patent Application No. 61/281,397, filed on Nov. 17, 2009.

This patent application provides details of the description of the above invention.

1. FIELD OF THE INVENTION

The present invention relates to a method and apparatus for Magnetic Resonance Imaging (MRI) based on Field Image Tomography (FIT) first developed by this inventor recently and applied to SPECT (Single-Photon Emission Computed Tomography) and PET (Positron Emission Tomography) imaging. FIT is a fundamental new theory for determining the three-dimensional (3D) spatial density distribution of field emitting sources. FIT is based on the observation that the 3D spatial density distribution of a field source and the 3D field intensity distribution produced by the source in its vicinity in a 3D volume space around it uniquely determine each other. The field can be the intensity of any type such as (i) Radio Frequency (RF) waves in MRI, (ii) Gamma radiation in SPECT/PET, and (iii) gravitational field of earth/moon for mapping the 3D tomography of the earth/moon.

FIT exploits the property that field intensity decreases or changes in a known way with increasing radial distance from the field source and the field intensity distribution measured, if necessary, in an extended 3D volume space reveals and therefore can be used to determine the 3D spatial density distribution of the emitting source elements. This fact has not been realized, recognized, or exploited in prior art on MRI, SPECT, and PET. On the other hand, sometimes (e.g. blurring due to large collimator apertures in SPECT) the field variation along the radial direction in a 3D volume space has been treated as an unwelcome, undesirable, valueless, nuisance effect to be avoided (e.g. by using very narrow field of view collimators in SPECT), or approximated as negligible within small radial distances, or undone through special image pre-processing operations such as deblurring. In prior art, unlike FIT, the variation of field intensity along the radial direction in a 3D volume space, when necessary, has not been pursued, sought, embraced, welcomed, or valued, as a source of critical information on the 3D spatial density distribution of the field source.

A method and apparatus are disclosed for MRI of target objects based on FIT. This method has the advantage of being faster than current methods by 50% to 80% or more in data capture. It specifically enables a 3D MRI video capture of moving organs like a pumping heart. This FIT method can be combined with current methods to improve the resolution quality of reconstructed MRI images.

2. BACKGROUND OF THE INVENTION

A fundamental problem with MRI in prior art is that RF emitting nuclei are distributed in a 3D volume space (x,y,z) but only one fully parallel spatial encoding scheme is available, that is frequency encoding. The phase encoding scheme is only partly parallel. Therefore sequential scanning is needed along at least one of the three dimensions (x,y,z) to image a target object in 3D space. This makes MRI in prior art slow. A fully parallel MRI to image a 3D volume space would need 3 independent fully parallel encoding schemes, one for each of the three Cartesian coordinates (x,y,z). In principle, the present invention FIT provides this facility. The three-dimensional spatial distribution f(x,y,z) of an RF emission source is encoded by the coordinates (x,y,z) themselves, in the sense that this f(x,y,z) uniquely determines and vice versa the 3D intensity distribution field g(x,y,z) of the RF emission produced by it in its vicinity in a 3D volume space around it. In other words, the 3D intensity distribution field g(x,y,z) is a function of (or depends on) three independent parameters, i.e. x, y, and z, not just on only one or two parameters such as frequency and phase in conventional MRI. FIT can be used as a stand-alone scheme for spatial encoding, or it can be combined with frequency encoding scheme for parallel MR imaging. It can also be combined with phase encoding scheme, or both frequency encoding and phase encoding schemes together. This technique of combining FIT with frequency and/or phase encoding schemes permits different trade-offs in the 3D imaging of objects in terms of speed, accuracy, cost, machine size, etc. In the preferred embodiment two-dimensional (2D) planar slices of a 3D target object are scanned sequentially along the Z-axis, and within a 2D slice location along the X-axis is encoded by frequency and Y-position is encoded by the Y-coordinate itself or the dependence of intensity or amplitude of radiation on the Y-coordinate. In this case, the conventional phase encoding has been replaced by spatial-coordinate encoding or amplitude encoding. Unlike the conventional phase-encoding technique, the method of the present invention is completely parallel and therefore much faster.

Principles of Field Image Tomography (FIT) in a different form with no name was first developed and applied for SPECT and PET imaging in the following patent application by this inventor, the teachings of which are incorporated herein by reference:
M. Subbarao, "Method and Apparatus for High-Sensitivity Single-Photon Emission Computed Tomography", U.S. patent application Ser. No. 12/586,863, filed on Sep. 29, 2009.

In the present invention FIT approach has been modified in a novel way and applied to Magnetic Resonance Imaging. A good introduction to an exemplary MRI system and associated problems can be found in the following US patent (U.S. Pat. No. 6,476,606 B2), the teachings of which are incorporated herein by reference:
R. F. Lee, "Method for Parallel Spatial Encoded MRI and Apparatus, Systems and Other Methods Related Thereto", U.S. Pat. No. 6,476,606 B2, Nov. 5, 2002.

In particular, MRI systems in prior art are very slow due to the so called phase-encoding step in data capture. This phase-encoding step can be avoided in the present invention for fast data capture and image reconstruction. As mentioned earlier, FIT can be used on its own or it can be combined with frequency or/and phase encoding techniques to achieve different trade-offs in speed, accuracy, cost, etc.

The method and apparatus of the present invention are specifically related to exploiting the information in the spatial intensity distribution of the three-dimensional (3D) radio frequency (RF) emission field in a 3D volume space. This information can reveal the 3D spatial density distribution of the RF emission source. In particular, the 3D volume space, when necessary, is designed to extend substantially along the radial distance pointing away from the RF emission source. The intensity of RF emission decreases with the square of the radial distance from the source and this variation in 3D space provides information on the location of the source. Therefore measuring the RF emission along different distances along the radial direction in addition to different angular directions is important.

FIT is based on analyzing the emission field intensity distribution in a three-dimensional (3D) volume space around the emission source. In particular, radiation intensity from a point source decreases with increasing square of the distance from the source, and this characteristic of radiation propagation is exploited in determining the location and intensity of point sources by measuring radiation intensity at different radial distances and analyzing the data. The radial distance r depends on all the three spatial coordinates x,y, and z, and therefore spatial localization in all the three coordinates becomes possible.

MRI machines in prior art are slow due to sequential scanning of different slices of the target object at different time instants. They do not include modeling and exploiting or measuring RF emission in a 3D volume space that extends substantially along the radial direction, even when that is needed and would be helpful.

Although there are a variety of spatial encoding methodologies or techniques being implemented, the most popular method used in commercial MRI scanners is two dimensional Fourier transform (2DFT) encoding in which a two-dimensional spatial plane (e.g., XY plane) is encoded with both frequency and phase of the MR signals. Typically during one data acquisition, only a one dimensional time-domain signal is obtained and thus 2DFT encoding requires repeating the data acquisitions sequentially to achieve a pseudo second dimension of the time domain signals. The second dimension of the spatial information is encoded into the phase component by repeating the data acquisition with different phase encoding gradient strengths i.e., varying magnetic field gradient along the y-axis Gy to create the other pseudo-time dimension. In this technique, each slice of the imaged object is in effect divided into a multiplicity of layers in the y-direction or axis corresponding to the number of pixels in that direction (e.g., 128, or 256). The number of pixels in turn is representative of the desired image resolution. The x-direction scanning process or the data acquisition is repeated by sequentially and repeatedly stepping through each of these y-direction layers. Because the resolution of the time-domain signals depends on the number of repetitions of the data acquisitions, and the repetition rate is limited by the MR relaxation times, a higher resolution image takes a longer time. In the present invention, this limitation can be relaxed by using more number of Radio Frequency Sensor Coils (RFSCs) at different positions and distances, and therefore the present invention can be made much faster.

There is a tradeoff between spatial resolution and imaging time because higher resolution images require a longer imaging time. This balance between spatial and temporal resolution is particularly important in cardiac MR, where fine details of coronary artery anatomy must be discerned on the surface of a rapidly beating heart. Thus, a high-resolution image acquired over a large fraction of the cardiac cycle, will be blurred and distorted by the motion of the beating heart.

In one embodiment of the present invention, the phase encoding is avoided by measuring the RF emission from one column of voxels parallel to the y-axis simultaneously with a plurality of RF sensitive coils (RFSCs) that are arranged in a 3D volume space in a non-degenerate configuration or arrangement. All voxels in a given column emit RF radiation at a constant frequency, but voxels in different columns emit RF radiation at different frequencies. The time-dependent emission radiation is measured by each coil and the resulting one-dimensional time signal is Fourier transformed to obtain the magnitude of different frequencies. The magnitude at each frequency gives the total radiation intensity emitted by all voxels in the corresponding column. The frequency itself encodes the position of the corresponding column along the x-axis. Different RFSCs are at different positions and distances from voxels in a column and therefore record different magnitudes for a given frequency. This measured difference in the magnitude of frequency components ultimately reveals the structure of the distribution of emission intensity from different voxels in a given column. The number of RFSCs must be comparable to the number of voxels in a column. They may lie on a line, curve, planar surface, curved surface, or distributed in a 3D volume space when necessary, so that the configuration is non-degenerate, i.e. the configuration is such that it captures and provides all the available and necessary information.

The present invention paves the road for true parallel MRI and the achievement of manifold reductions in minimum MRI scan-time for rapid dynamic studies that require high time resolution. The present invention can be used to find the 3D tomography of any field emitting source. For example, as mass emits gravitational field, the 3D density of earth, moon, and other such bodies can be determined by measuring the gravitational field in a large 3D volume space around these objects. The 3D volume space, when necessary, is extended both in radial and angular directions. The basic principle remains the same as that described in the present invention. The present invention can also be used with radiation frequencies (e.g. millimeter waves or microwaves) other than Radio Frequencies along with suitable magnetic fields. The present invention can also be used to make small (about the size of a hair dryer or a kitchen microwave) portable FIT machines for MRI.

2.1 Theoretical Basis of the Present Invention

The insight and inspiration that led to the present invention are two inventions for image deblurring and 3D shape-from-defocus techniques disclosed by this inventor in the following two patents:

1. M. Subbarao, "Methods and apparatus for computing the input and output signals of a linear shift-variant system", Jul. 7, 2009, U.S. Pat. No. 7,558,709.
2. M. Subbarao, "Direct Vision Sensor for 3D Computer Vision, Digital Imaging, and Digital Video", Aug. 18, 2009, U.S. Pat. No. 7,577,309.

The present invention is based on a new theory. It is based on measuring and inverting weighted volume integrals instead of simple line integrals corresponding to Radon Transform used in the past in older MRI methods. The weighting factor in the volume integrals corresponds to the reciprocal of the square of the distance between a field emitting source element and the field measuring element (RFSCs in MRI). In MRI, RF sensitive coils are used to measure total emission from many or all the emission source elements in a certain 3D volume space.

Another fundamental feature of the new theory is that weighted Volume integrals must be measured in a 3D volume space that may extend substantially along the radial direction pointing away from the emission source. Measuring on a thin surface that is roughly perpendicular to the direction of emission rays as in the conventional MRI theory may not be adequate in some problems. For example, RF emission from a source inside a human body may be measured in a 3D volume space in the shape of a thick annular cylinder, with an inner radius of 200 mm and an outer radius of 600 mm. Alternatively, measurements can also be taken on a small set of concentric circles of different radii, or concentric polygons of different sizes. Therefore, in the present invention, weighted 3D volume integrals of spatial density distribution of the emission source are measured at a set of points that could be spread out in a 3D volume space.

The validity of the present invention has been verified through simple computer simulation experiments. A discrete source distribution was generated using a random number generator. The measured radiation field due to this distribution was computed at a discrete set of points by using a model of radiation propagation. This measured data was successfully inverted to obtain the original spatial distribution of the radiation source.

2.2 Detailed Theory: Deriving H and g=Hf+n

In this section additional details are provided on deriving a system matrix H and the equation g=Hf+n which is the basis of the method of the present invention.

A 3D volume space V is selected in a target object whose 3D tomography needs to be imaged by MRI. This volume V of the target object is placed in a known magnetic field B. In the first embodiment of the present invention, B is a constant field within volume V. The nuclei of atoms in the material substance of the target object are usually spinning like a top and produce a magnetic field of their own. These spinning nuclei will become aligned so that their magnetic fields will be parallel or anti-parallel with the magnetic field B. In addition, magnetic field B exerts a torque on the spinning nuclei, and therefore they precess like a spinning top with Larmor frequency around the axis along the direction of B. Larmor frequency w is given by w=γB where γ is the gyromagnetic constant of the nuclei which is different for nuclei of different elements.

A suitable Radio Frequency (RF) pulse is beamed into the volume V of the target object so that many of the nuclei whose magnetic field are parallel or aligned with B are excited through energy absorption and become anti-parallel to B. (A second RF beam may be sent to realign the magnetic axes of the nuclei for some purpose such as facilitating measurement.) These excited nuclei then gradually lose their absorbed energy and return to their normal state which is parallel to B, and in this process the lost energy is emitted as RF emission. The amount or intensity of RF emission from each small volume element or voxel in V is a characteristic of the density of different types of nuclei, e.g. Hydrogen nuclei of water, in the material of the target object in V. By determining the intensity f(x,y,z) of this RF emission from each voxel located at Cartesian coordinates (x,y,z) in volume V of the target object, the 3D tomographic Magnetic Resonance Image f of the target object is obtained. However, in practice, it is possible to measure only the total sum or volume integral of RF emission from all the voxels in V. It is not possible to measure the RF emission intensity f(x,y,z) separately from individual voxels at (x,y,z). Therefore this measured volume integral (which is weighted by the factor of reduction in radiation intensity with distance from the source element) needs to be processed to reconstruct the original image f(x,y,z).

Radio Frequency Sensitive Coils (RFSCs) are used to measure the sum or volume integral of RF emission from all the voxels in V. In the prior art on MRI, this problem of measuring emission from individual voxels is solved in a few different ways. In the first way, a method similar to that in X-ray Computed Tomography is used. In this method, volume V is restricted to be a thin line or column of volume space. This is achieved by using a magnetic field B that linearly varies along one dimension, say the Z-axis in a Cartesian coordinate system centered in the target object. Then an RF pulse of a certain frequency is sent to select and excite only a thin two-dimensional (2D) slice or cross-section parallel to the X-Y plane in the target object that is perpendicular to the Z-axis. Within this 2D plane, a single line or column of voxels is frequency encoded by introducing a gradient magnetic field perpendicular to the Z-axis, say a field that increases linearly along the positive X-axis. In this case the field is a constant along lines parallel to the Y-axis and therefore voxel columns parallel to the Y-axis contain nuclei that are spinning with a constant frequency. On the other hand, the frequency of nuclei will increase from one column to the next along the positive X-axis. In this way spatial location along the X-axis of columns of voxels are frequency encoded by associating a unique frequency for each column position along the X-axis.

RF coils sense the total emission signal from all the voxels in the selected slice that has been excited by the RF pulse, and the Fourier Transform of the sensed signal gives a parallel projection or line integral of the RF emission from the slice. By rotating the direction of the gradient field around the Z-axis (to say 90 different angles at 2 degree intervals in the range 0 to 180 degrees) such a projection (also called the Radon Transform) of the slice can be obtained for (around 90) different angles in the X-Y plane. Then, a tomographic image reconstruction algorithm such as the Filtered-Back Projection (FBP) or Algebraic Reconstruction Technique (ART) can be used to determine the two-dimensional (2D) intensity distribution f(x,y) of the RF emission from voxels in the selected slice of the target object. This method is repeated for different thin successive 2D slices perpendicular to the Z-axis, and the results are stacked together in proper order to obtain a 3D tomographic image of the entire target object.

The above method is slow due to the scanning of different 2D slices in sequence at first, and then scanning of different angles in each slice. This scanning may take up to 30 minutes for a whole body scan of a target object during which a patient may have to be sedated to avoid motion of the body.

In another approach, instead of rotating the gradient magnetic field to different angles in the previous method, spatial position of voxels within a column are further encoded by a complicated phase encoding technique, and a 2D Fourier Transform is used for tomographic image reconstruction. This phase encoding technique involves sending RF pulses repeatedly and taking measurements. This method is faster than the first approach, but still much slower than the present invention. The present invention is estimated to take around 80% less time than this phase-encoding method as there is no sequential scanning. Instead, a plurality of RFSCs placed at different positions and distances are used to simultaneously measure the radiation field intensity in a 3D volume space around the target object. This measured data is then processed to reconstruct the 3D tomography of the target object.

In the present invention, in principle, there is no need to scan either one 2D slice at a time in a 3D volume, or scan projections at different angles or phase-encode within a 2D slice. In the present invention, 3D tomography can be obtained at once by taking measurements of RF emission from the entire 3D volume V at once. However, in practice, scanning one 2D slice at a time, but reconstructing an entire 2D slice at once without scanning for angles/directions or phase is a good approach in the method of the present invention. Otherwise the number of RFSCs needed will be too many and this poses difficulties in designing the imaging machine. It is also possible to use both frequency encoding and phase encoding to select a volume space V, and then within this volume space apply the method of the present invention to determine higher resolution tomographic image of the target object.

Next the equation g=Hf+n will be derived for the field image g. An RF emission source Q of unit intensity (power or energy per unit time, e.g. 1 watt) at a point (x,y,z) as in FIG. 4 produces an emission field of intensity $1/(4\pi r^2)$ (watts/meter sq.) at a distance of radius r from the source. This is due to the fact that the emitted 1 unit of power is uniformly distributed over a spherical surface of area $4\pi r^2$ as the energy propagates from the source point to the surface of the sphere.

Figure 4:
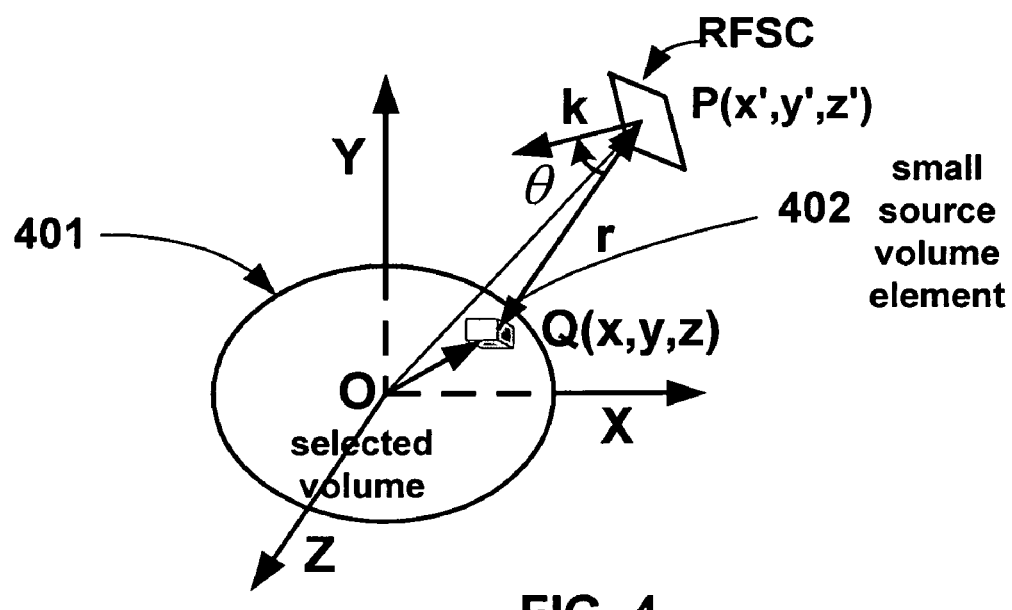

Let f(x,y,z) be the density (watts/meter cubed) of the RF source at a point Q with coordinates (x,y,z) in a body. The RF source element in a small volume element dv=dxdydz at Q(x,y,z) produces an RF emission field at another point P(x', y',z') as shown in FIG. 4 given by $$f(x,y,z)dxdydz\ h(x'-x,y'-y,z'-z)\ \text{watts/m}^2 \quad (\text{Eq. 2.1})$$

where $$h(x'-x,y'-y,z'-z)=1/(4\lambda r^2) \quad (\text{Eq. 2.2})$$

and $$r^2=(x'-x)^2+(y'-y)^2+(z'-z)^2 \quad (\text{Eq. 2.3})$$

Let a small sensor element of area dA with unit surface normal vector k pointing away from the RF source be placed at (x',y',z'). Let the angle between this vector k and direction of RF emission $$i=(x'-x,y'-y,z'-z)/|(x'-x,y'-y,z'-z)|$$

be θ(x',y',z',x,y,z). For example, if area dA is facing the origin with $$k=(x',y',z')/|(x',y',z')|$$

then $$\begin{aligned}\cos(\theta(x',y',z',x,y,z)) &= k \cdot i \\ &= x'(x'-x)+y'(y'-y)+z'(z'-z)/\\ &\quad (|(x'-x,y'-y,z'-z)||(x',y',z')|)\end{aligned}$$

For a given RF emission frequency u, the RF emission intensity at the 3D point P(x',y',z') due to all of the source f(x,y,z) emitting RF at frequency u is the sum or integral of the field due to each of the volume element, given by:

$$g(x',y',z') = \int\int_V\int h(x'-x,y'-y,z'-z) \quad (\text{Eq. 2.4})$$
$$f(x,y,z)\cos(\theta(x',y',z',x,y,z))dxdydz$$

The above equation is named the Field Image Equation (FIE). In the above equation, only the intensity or amplitude of the RF emission at a single frequency u is considered. However the time dependent signal recorded by RFSCs may contain a plurality of frequencies if FIT is combined with frequency encoding for one of the dimensions, say along the x-axis. In this case the time signals are Fourier transformed and the magnitude of the Fourier transform at frequency u is then used to obtain one equation as above. For each different frequency u, one separate equation as above is obtained and solved. Therefore g(x',y',z') in the above equation should be considered as the magnitude of the one-dimensional Fourier Transform of the actual time-dependent signal g'(x',y',z',t) at some frequency u wherein the Fourier Transform is computed with respect to the time variable t. In this case, a one-to-one correspondence exists between the frequency u in the Fourier domain and the spatial position x of f(x,y,z) which has been frequency encoded by u. Therefore we use g(x',y',z') to denote the measured amplitude at (x',y',z') for a given frequency u corresponding to x in f(x,y,z).

If, as in FIG. 4, a small sensor element P is placed at (x',y',z') with unit surface area dA and the surface normal is at an angle of θ(x',y',z',x,y,z) with respect to the direction of incidence of RF emission from the source volume element at (x,y,z), then the measured RF field intensity g(x',y',z') at (x', y',z') is $$g(x',y',z')=f(x,y,z)h(x'-x,y'-y,z'-z)\ dxdydz\ \cos(\theta(x',y',z',\\x,y,z))\ \text{watts/m}^2 \quad (\text{Eq. 2.4}).$$

(but the actual measured power by one sensor element is g(x',y',z') dA watts).

In MRI, attenuation of RF emission as it traverses through the target object is taken to be negligible.

If this emission is attenuated by the RF sensitivity coil geometry by a factor of a(x',y',z',x,y,z), then the measured radiation will be $$g(x',y',z')=f(x,y,z)h(x'-x,y'-y,z'-z)\ dxdydz\ \cos(\theta(x',y',z',\\x,y,z))\ a(x',y',z',x,y,z) \quad (\text{Eq. 2.6})$$

If there is no such attenuation, then a(x',y',z',x,y,z)=1 for all (x',y',z',x,y,z).

In the discrete domain let us define the system matrix H(x',y',z',x,y,z) as $$H(x',y',z',x,y,z)=h(x'-x,y'-y,z'-z)\cos(\theta(x',y',z',x,y,z))a\\(x',y',z',x,y,z) \quad (\text{Eq. 2.7}).$$

Therefore, the measured RF field intensity (amplitude) due to the presence of all RF source elements distributed in the (x,y,z) space with density f(x,y,z) can be expressed in the discrete domain as $$g(x',y',z') = \sum_x\sum_y\sum_z H(x',y',z',x,y,z)f(x,y,z). \quad (\text{Eq. 2.8})$$

In the above equation, unit volume was taken to be that of one voxel so that the term dxdydz=1. The summation is carried-out over all volume elements or voxels at points (x,y,z) where the RF source may be present. Due to noise and measurement errors together contributing n(x',y',z') to the above measured value, we obtain:

$$g(x',y',z') = \quad (\text{Eq. 2.9})$$
$$\sum_x\sum_y\sum_z H(x,y,z,x',y',z')f(x,y,z)+n(x',y',z')$$

Let the RF field (amplitude) g(x',y',z') be measured at a sufficiently large number of points (x',y',z') in a 3D volume space S in the vicinity of the RF source. These points need not be in any regular pattern such as a grid. They need not even be contiguous or close. They could be distributed randomly. But there will be an optimal geometry for the placement of the measurement points which may depend on the target object of study. The minimum number of points is the minimum number of voxels in which the radiation source may be present. But these minimum number of points (x',y',z') must not be a degenerate set, e.g. for certain target objects they should not lie on a surface at constant radial distance. In general, they would have to lie in a 3D volume space that extends substantially along the radial direction. Otherwise the above equation may not be solvable, unless the selected volume V itself has a restricted shape, such as a plane or a line. In the case of a non-degenerate set g(x',y',z'), the above equation can be expressed in vector matrix form using conventional notation as $$g = Hf + n \qquad \text{(Eq. 2.10)}$$

Given measured values of g in a 3D volume space at a set of points (x',y',z'), it has been verified through simulation experiments that the above equation can be solved to obtain f. The effect of noise is reduced by using a suitable optimization method in the prior art.

3. DRAWBACKS OF PRIOR ART

A fundamental drawback of prior art is that conventional MRI is slow, about 15 minutes or longer to scan a patient during which the patient has to be motionless and possibly sedated to stay motionless. Slow MR imaging also introduces motion blur while imaging moving organs such as a beating heart. Another drawback is that the image quality is poor due to noise and image distortion. A further drawback is the high cost of the MRI machine.

4. OBJECTS AND ADVANTAGES OF THE INVENTION

It is an object of the present invention to provide a fast MRI method and apparatus that is comfortable for patients by reducing the length of time during which they need to be motionless during MRI scans, from around 15 minutes to less than 5 minutes, and possibly avoiding the use of sedation to help the patient to stay motionless.

It is another object of the present invention to provide a very fast MRI method for imaging dynamic organs such as a beating heart with minimal motion blur and high time resolution.

It is another object of the present invention to provide higher quality MRI images by reducing the effects of noise and distortion, and improving the spatial and contrast resolutions. Therefore the present invention provides a more accurate clinical diagnosis of patients due to the improved quality of MRI images.

It is another object of the present invention to provide a safer MRI imaging apparatus and method that uses a lower level of magnetic field and shorter duration of RF radiation.

Another object of the present invention is to provide a cheaper MRI imaging method and apparatus.

Further objects and advantages of the present invention will become apparent hereinafter to those with ordinary skill in the art to which the present invention pertains.

5. BRIEF DESCRIPTION OF THE DRAWINGS

For a fuller understanding of the nature and desired objects of the present invention, reference is made to the following detailed description taken in conjunction with the accompanying drawing figures wherein like reference numbers denote corresponding parts throughout the several views.

FIG. 1 is a schematic view of an exemplary magnetic resonance imaging (MRI) system adapted for use with the parallel encoding methodology according to the present invention; The MRI system 100 includes an electromagnet 102, a computer 106, a main magnetic field control 108, a gradient coil sub-system 110, a gradient field control 112, an imager 114, a display device 116, an RF antenna sub-system 126, a T/R switch 120, an RF transmitter 122 and a receiver 124. It also includes an array of RFSCs 125 in a non-degenerate configuration in a 3D volume space.

Figure 2:
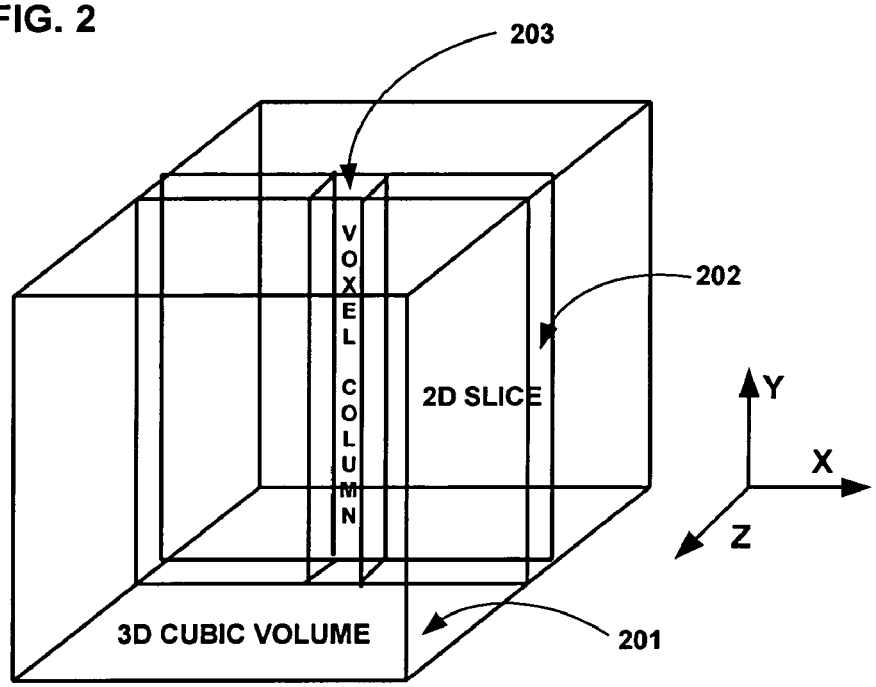

FIG. 2 shows a 3D cubic volume 201 which contains a portion of the target object whose MRI needs to be reconstructed. This entire volume can be selected for study by introducing a constant magnetic field B and beaming a suitable RF pulse (with Larmor frequency w=γB). Many nuclei throughout the volume will be excited. In another embodiment of the present invention, a 2D slice 202 parallel to the x-y plane can be selected for study by applying a gradient magnetic filed along the z-axis and sending an RF radiation of suitable frequency. After selecting the 2D slice, a column of voxels 203 parallel to the y-axis can be spatially encoded with frequency by applying a gradient magnetic field along the x-axis.

Figure 3:
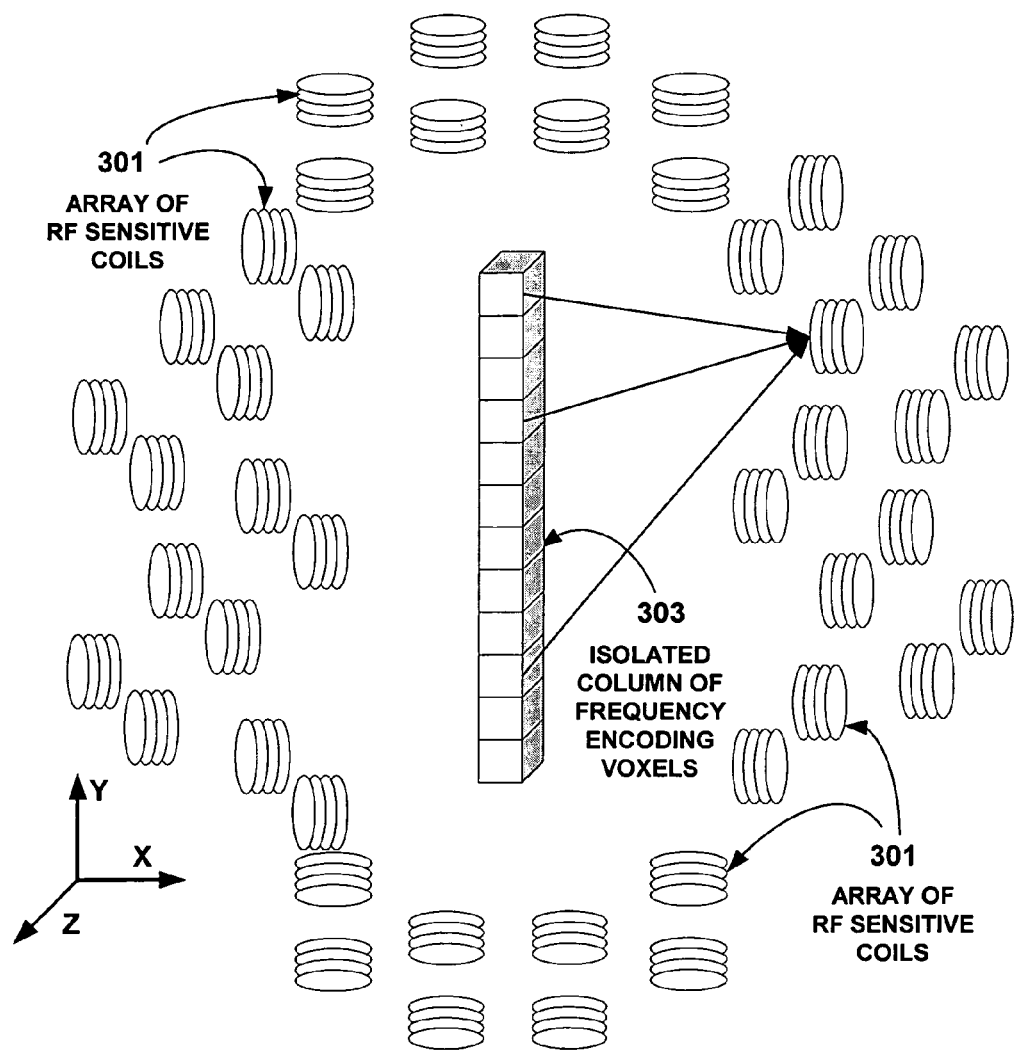

FIG. 3 shows an isolated column 303 of frequency encoded voxels parallel to the y-axis that are excited and emitting RF radiation at a constant frequency u. This RF emission is sensed by an array of RF sensitive coils 301. Fourier transforming the time dependent signals recorded by the RF sensitive coils with respect to the time dimension gives the magnitude of the RF field at frequency u. This array of RF sensitive coils may be distributed in a 3D volume space arranged in a non-degenerate configuration around the column of voxels. The spatial location and intensity of voxels are determined by analyzing the field intensity distribution of the RF emission.

FIG. 4 shows the geometry of emission radiation from a small volume element 402 or Q at (x,y,z) sensed by an RF coil P at (x',y',z'). It also shows the sensitivity normal vector k of the coil P and the angle of incidence θ between this normal and the emitted radiation along QP. The distance between the source element 402 or Q and detector coil P is r. This geometry is used to compute the system matrix H described earlier. The source element Q is located at (x,y,z) which is inside the selected volume V of the target object of study indicated by 401.

FIG. 5 shows a flow-chart of one embodiment of the method of the present invention.

6. BRIEF SUMMARY OF THE INVENTION

A fundamental problem with MRI in prior art is that RF emitting nuclei are distributed in a 3D volume space (x,y,z) but only one fully parallel spatial encoding scheme is available, that is frequency encoding. The phase encoding scheme is partly parallel. Therefore sequential scanning is needed along at least one of the three dimensions (x,y,z) to image a target object in 3D space. This makes MRI in prior art slow. A fully parallel MRI to image a 3D volume space would need 3 independent fully parallel encoding schemes. In principle, the present invention FIT provides this facility. The three-dimensional spatial distribution f(x,y,z) of an RF emission source is encoded by the coordinates (x,y,z) themselves in the sense that this f(x,y,z) uniquely determines and vice versa the 3D intensity distribution field g(x,y,z) of the RF emission produced by it in its vicinity in a 3D volume space around it. FIT can be used as a stand-alone scheme for spatial encoding, or it can be combined with frequency or/and phase encoding scheme for parallel MR imaging.

The present invention discloses a Magnetic Resonance Imaging (MRI) Apparatus that comprises
 (a) a magnet that produces a magnetic field in a selected volume space in a target object whose three-dimensional (3D) tomographic image is desired,
 (b) at least one radio frequency (RF) pulse generator capable of producing an RF pulse to excite spinning atomic nuclei in the selected volume space in the target object, and (c) multiple RF sensitivity coils (RFSCs) that can measure RF radiation field intensity in a 3D measurement volume space in the vicinity of the target object. The 3D measurement volume space in particular may extend substantially along at least one radial direction pointing away from an approximate center point of the target object. This facilitates RF radiation field measurements to be made at a plurality of different radial distances from the target object in addition to different angular directions with respect to the target object.

In this apparatus, the multiple RFSCs may be constructed so that they can be moved to different spatial positions in the 3D measurement volume space. At each position the RF radiation field intensity is measured so that measurements are made in a larger 3D measurement volume space than the volume space occupied by the RFSCs. The selected 3D volume may extend significantly in all three spatial dimensions (x,y,z). Alternately, the selected 3D volume may be a thin two-dimensional (2D) planar slice. In this case the magnet is provided with the ability to produce a magnetic field that varies in a first direction (Z) approximately perpendicular to the 2D planar slice (in the x-y plane by convention). In this arrangement, a suitable RF pulse can be used to excite only those spinning nuclei that lie on the 2D planar slice.

In another embodiment of the apparatus, the selected 2D planar slice is a thin one-dimensional (1D) line space (along the y-axis), and in this case the apparatus further includes a second magnet that produces a gradient magnetic field along a second direction (X-axis) that is roughly perpendicular to the 1D line space and the first direction (Z-axis).

In another embodiment, the selected 1D line space above is made to be a small volume element (i.e. a single voxel) that extends only by a small length along all three spatial dimensions (x,y,z) and the apparatus further includes a means for encoding phase of RF emissions from the target object.

The magnet in the apparatus can be an electro-magnet or a permanent magnet. The RFSCs in the apparatus can be a three-dimensional (3D) or alternately a two-dimensional (2D) planar array of RF sensitivity coils. The 2D array of coils may be moved to different positions to measure the RF field in a 3D volume space.

The apparatus can further include a Single-Photon Emission Computed Tomography (SPECT) apparatus. In this case, the MRI apparatus is used to measure the attenuation of the target object medium for photons in SPECT. Instead of the SPECT machine, the apparatus can be combined with a Positron Emission Tomography (PET) apparatus.

The present invention discloses a method of reconstructing a tomographic image f of a target object using a magnetic resonance imaging (MRI) apparatus. The method comprises the following steps:

(a) selecting a three-dimensional (3D) volume space V in the target object; the selected 3D volume space V is specified by a set of small volume elements or voxels;

(b) introducing or beaming a magnetic field B into the 3D volume space V;

(c) sending or beaming a pulse of Radio Frequency (RF) radiation into the 3D volume space V; this pulse RF radiation is chosen so as to excite spinning nuclei of atoms of the target object present in the volume V to a higher energy state; this causes an RF emission from the excited nuclei with intensity f which characterizes the material of the target object at each voxel;

(d) measuring a discretely sampled vector of values g of the RF emission field intensity due to RF emission from the excited spinning nuclei in the 3D volume space V; measurement in this step is made at a discrete set of points in a 3D measurement volume space S near the target object; the 3D measurement volume space S may in general extend substantially along at least one radial direction pointing away from an approximate center of the 3D volume space V; measurement in this step is made using a plurality of RF sensitive coils (RFSCs), (e) determining a system matrix H of values using i. the distance and geometry between pairs of voxels (v,s) where v is a voxel in V and s is a voxel in S, and the geometry and sensor characteristics of the plurality of RFSCs, ii. the property of radiation propagation that the intensity per unit area of RF emission field decreases with the square of radial distance from the emission source and therefore facilitating the use of data values in g to determine f, and iii. a discrete vector n of values that represents the effects of noise on measurements in step (d) above, so that measured data vector g is related to tomographic image vector f through the system matrix H and noise n by the equation g=Hf+n; and (f) solving the above equation g=Hf+n for the desired quantity f by a method that reduces the effect of noise n significantly; with these steps, the desired goal of determining the tomographic image f of the target object in the 3D volume space V is achieved.

In the above method, Step (f) of solving for f can be based on any of the following possible alternatives: (i) a Singular-Value decomposition of H and spectral filtering or regularization, (ii) maximizing the probability of observing g given f, and (iii) an iterative algebraic reconstruction technique. In all of these methods, Step (f) of solving for f can use the positivity constraint that all components of f are non-negative, i.e. zero or more.

In the method of the present invention, the selected 3D volume can extend significantly in all three spatial dimensions (x,y,z). Alternately, the selected 3D volume can be a thin two-dimensional (2D) planar slice and the magnet must be capable of producing a magnetic field that varies in a first direction (z-axis) approximately perpendicular to the 2D planar slice (x-y plane). In another embodiment of the method, this selected 2D planar slice can be a thin one-dimensional (1D) line space (along the y-axis), and in this case the apparatus must further include a second magnet that can produce a gradient or varying magnetic field along a second direction (x-axis) that is roughly perpendicular to the 1D line space and the first direction (z-axis).

In another embodiment of the method of the invention, the selected 1D line space can be a single voxel or small volume element that extends only by a small length along all three spatial dimensions (x,y,z) and the apparatus further includes a means for encoding phase of RF emissions from the target object.

7. DETAILED DESCRIPTION OF THE PREFERRED EMBODIMENT

7.1 Apparatus of the Invention

Referring now to the various figures of the drawing wherein like reference characters refer to like parts, there is shown in FIG. 1 a schematic view of an exemplary magnetic resonance imaging (MRI) system 100 adapted for use with the Field Image Tomography (FIT) according to the present invention. Although a MRI system having a main magnet comprising a certain-shaped magnet is illustrated, this shall not constitute a limitation. Reference is made to U.S. Pat. No.

4,968,937, the teachings of which are incorporated by reference for other details of the exemplary MRI system 100.

The MRI system 100 includes an electromagnet 102, a computer 106, a main magnetic field control 108, a gradient coil sub-system 110, a gradient field control 112, an imager 114, a display device 116, an RF antenna sub-system 126, a T/R switch 120, an RF transmitter 122 and a receiver 124. It also includes an array of RFSCs 125 in a non-degenerate configuration such as a 3D volume space that extends in both radial and angular directions. The electromagnet 102 produces a strong main magnetic field Bo across a gap between pole pieces 104 of the electromagnet. In use of the MRI system a body 2 or object to be imaged, for example a patient, is placed in the gap between the pole pieces 104 on a suitable support (not shown). The strength of the electromagnetic field in the gap between the pole pieces 104, and hence in the body 2, is controlled by the computer 106 via a main magnetic field control 108, which controls the supply of energizing current to the electromagnet energizing coil.

The gradient coil sub-system 110, having one or more gradient coils, is provided so a magnetic gradient can be imposed on the static magnetic field in the gap between the poles pieces 104 in any one or more of three orthogonal directions x, y, and z. The gradient coil sub-system 110 is energized by a gradient field control 112 that also is under the control of the computer 106.

The RF antenna sub-system 126 of a conventional parallel MRI data acquisition type of system typically includes a plurality or more of coils arranged to simultaneously detect the MR signals from the body 2. The RF antenna sub-system 126 is selectably interconnected to one of the RF transmitter 122 or the receiver 124 by the T-R switch. The RF transmitter 122 and/or the T-R switch 120 are under the control of the computer 106 so that RF field pulses or signals are generated by the RF transmitter 122 and selectively applied to the body 2 for excitation of magnetic resonance in the body by the RF antenna subsystem 126. While these RF excitation pulses are being applied to the body 2, the T/R switch 120 also is actuated so as to de-couple the receiver 124 from the RF antenna subsystem 126.

The RFSC array 125 contains a plurality of RF sensitive coils to measure RF emission in a 3D volume space between the magnets 104.

Following application of the RF excitation pulses, the T/R switch 120 is again actuated to de-couple the RF antenna sub-system 126 from the RF transmitter 122 and to couple the RF antenna sub-system to the receiver 124. At the same time, RFSC array is activated for receiving and measuring RF radiation from Object 2. The RF antenna sub-system 126 and 125 in this arrangement detects or senses the MR signals resulting from the excited nuclei in the body and passes the MR signals onto the receiver 124. These detected MR signals are in turn passed onto the imager 114. The imager 114, under the control of the computer 106, and implementing Field Image Tomographic MRI methodology of the present invention, processes the MR signals to produce signals representing an image of the body 2. These processed signals representative of the image are sent onto a display device 116 to provide a visual display of the image.

In operation, the uniform magnetic field Bo generated by the main or primary magnet(s) 102 is applied to the body 2 by convention along the z-axis of a Cartesian coordinate system, the origin of which is within the imaged object. The uniform magnetic field Bo being applied has the effect of aligning the nuclear spins, a quantum mechanical property of macroscopic particles comprising the body 2, along the Z-axis. In response to RF pulses of the proper frequency being generated by the RF transmitter 122, that are orientated within the XY plane, the nuclei resonate at their Larmor frequencies. In a typical imaging sequence, the RF signal centered about the desired Lamor frequency is applied to the body 2 at the same time a magnetic field gradient Gz, is being applied along the z-axis by means of the gradient control sub-system 110. This gradient field Gz causes only the nuclei in a slice with a limited width through the body 2 along the XY plane, to have the resonant frequency and to be excited into resonance. Let the voxel index or position of the 2D slice parallel to the XY plane be located at Z=k. These slices with thickness d are scanned in sequence in later steps at different successive positions k=1, 2, 3, . . . , K.

After excitation of the nuclei in the slice, magnetic field gradient Gx is applied along the X-axis. The gradient Gx along the X-axis causes the nuclei to precess at different frequencies u depending on their position along the X-axis, that is, Gx spatially encodes the precessing nuclei by frequency (i.e., frequency encoding). For simplicity let the discrete position of voxels along the X-axis be X=m for m=1, 2, . . . , M, with corresponding frequencies u=1, 2, . . . , M, respectively). Similarly, let the discrete position of voxels along the Y-axis be p for p=1, 2, 3, . . . , P.

The excited nuclei then emit RF radiation losing energy and return back to their normal state. This emission induces a time dependent signal in the RFSCs. Let this be denoted by G(x',y',z',t), from the emission source voxel f(X,Y,Z)=f(m,p,k). Then the amplitude (or power spectrum) of the one-dimensional (1D) Fourier transform with respect to time of G(x',y',z',t), denoted by g(x',y',z',u)=g(x',y',z',m) gives the total RF radiation from a column of voxels (i.e. summation of RF radiation from P voxels along the Y-axis) at f(x,y,z)=f(m,p,k) for p=1, 2, 3, . . . , P, with fixed values for m and k. It is the relation between these two amplitude signals g(x',y',z',m) and f(x,y,z)=f(m,p,k) that are used in FIT. From Equation (2.9) derived earlier we obtain $$g(x', y', z', m) = \sum_x \sum_y \sum_z H(x, y, z, x', y', z')f(x, y, z) + n(x', y', z'),$$

The following equation is equivalent to the above equation as (x,y,z)=(m,p,n) (note the limits of integration where x=m and z=k are fixed but y=1 to P):

$$g(x', y', z', m) = \sum_{x=m}^{m} \sum_{y=1}^{P} \sum_{z=k}^{k} H(x, y, z, x', y', z')f(x, y, z) + n(x', y', z')$$

which can be written using a vector matrix notation as $g=Hf+n.$

In the above equation, m and k are known constants and the unknowns are the values of the voxels f(m,p,k) for p=1, 2, 3, . . . , P. By measuring g(x',y',z',m) at many different positions (which form a non-degenerate set) in a 3D volume space at points (x',y',z'), we can solve the above equation for the unknowns. The equation becomes solvable for a non-degenerate set of measurement positions but it will be unsolvable (due to being under-constrained) for a degenerate set of measurement positions. This solution is obtained without any sequential scanning along the Y-axis as in the phase-encoding method. By repeatedly solving the equation g=Hf+n for different voxel rows specified by m, we obtain the 3D tomography of the entire 2D slice at position Z=k. By repeating this method for different 2D slices specified by k, we obtain the 3D tomography of the entire target object in a selected volume V. Consequently, the time taken to create the complete image of the body 2 is significantly reduced as compared to conventional MRI systems that embody serial encoding techniques or methodologies for the y-position encoding.

In the embodiment of the invention described above, the sequential scanning in the Y-direction for data capture found in prior art has been avoided. In this embodiment the number of RFSCs needed is reasonable and practical (around 25 to 250) at present. By using additional RFSCs (around 1000) it would be possible to remove sequential scanning of data capture along the Z-axis also. In this case, the following change is made to the above method and apparatus. First a constant magnetic field Bo is applied along the Z-axis in the selected volume V of the target object. Then a suitable RF pulse is beamed in to excite nuclei in the entire volume V. Next a magnetic gradient field Gz is applied along the Z-axis so that nuclei in different slices along the Z-axis parallel to the X-Y plane are precessing at different resonant frequencies, but voxels within a given slice will all have nuclei precessing at a constant frequency. This encodes the position along the Z-axis of different 2D slices with different resonant frequencies.

As the excited nuclei return to their normal state, nuclei in each 2D slice parallel to the X-Y plane emit RF radiation at a different frequency u. This emitted radiation is detected by RFSCs and the resulting time dependent signal $G(x',y',z',t)$ is recorded as in the previous method. The one-dimensional (1D) Fourier transform with respect to time of this $G(x',y',z',t)$, denoted by $g(x',y',z',u)=g(x',y',z',m)$ gives the total RF radiation from a 2D slice of voxels (i.e. summation of RF radiation from all voxels in a slice) at $f(x,y,z)=f(m,p,k)$ for all possible values of $(m,p)$ but with a fixed value for k. Then the equation $g=Hf+n$ is solved once at each frequency corresponding to one 2D slice parallel to the X-Y plane. This provides the solution for the intensity of RF radiation emitted from each voxel in the 2D slice. By solving this equation once for each 2D slice (or frequency), we obtain the complete 3D tomography of the target object in the entire 3D volume V, In this embodiment, unlike prior art, sequential data capturing has been completely avoided by using a large number of RFSCs. This embodiment would be ideal for capturing 3D video tomography of dynamic organs like a beating heart.

7.2 Method of the Invention

The present invention discloses a method of reconstructing a tomographic image f of a target object using a magnetic resonance imaging (MRI) apparatus. The method is based on the novel Field Image Tomography principle. The tomography f of the target is represented by a 3D spatial function $f=f(x,y,z)$.

The method comprises the following steps. A three-dimensional (3D) volume space V is selected in the target object. This selected 3D volume space V is specified by a set of small volume elements or voxels. A magnetic field B is introduced or beamed into the 3D volume space V. Let the direction of this magnetic field be along the Z-axis in a suitable coordinate system. This causes spinning nuclei in the material of the target object to align along the magnetic field and precess with a corresponding Larmor frequency. Depending on this frequency, a suitable pulse of Radio Frequency (RF) radiation is beamed into the 3D volume space V. The frequency of this pulse RF radiation is chosen so as to excite spinning nuclei of atoms of the target object present in the volume V to a higher energy state. The excited nuclei lose their extra energy absorbed from the RF pulse over a short period of time, and this lost energy is emitted as an RF emission from the excited nuclei with intensity $f=f(x,y,z)$ which characterizes the material of the target object at each voxel.

In the preferred embodiment of the present invention, this selected volume V corresponds to a single column of voxels parallel to the Y-axis. The selection of such a column of voxels is made in two steps. In the first step, a gradient magnetic field Gz is introduced along the Z-axis and a 2D slice of the target object parallel to the X-Y plane is selected by appropriately choosing a frequency and beaming an RF pulse with the chosen frequency. This excites only those nuclei that are in the selected 2D slice. Within this 2D slice, voxels along different columns parallel to the Y-axis are selected by frequency encoding the columns. This frequency encoding is done by introducing another magnetic gradient field Gx along the X-axis of the selected 2D slice. The selected volume V corresponds to the volume occupied by all the voxels in one selected column.

The computational method for determining the tomography of the target object within this volume is based on FIT and it is described next. In the preferred embodiment of the present invention, the data capture for different columns within a 2D slice is done simultaneously or in parallel in the form of a time dependent signal measured by RFSCs. A one-dimensional Fourier transform of this signal with respect to time provides the total RF emission from each of the columns. The magnitude of this 1D Fourier transform at different frequencies provide the data needed for different columns of voxels. The magnitude of the 1D Fourier transform at the frequency that corresponds to the column of voxels that occupy the selected volume V is denoted by $g=g(x',y',z')$ where $(x',y',z')$ represents the spatial coordinates of the position of the RFSC which measures the data. This measurement is made by a plurality of RFSCs located at different positions $(x',y',z')$. These positions should constitute a non-degenerate set so that they capture sufficient information to make the tomographic equation $g=Hf+n$ solvable. For a degenerate set of $(x',y',z')$, the tomographic equation $g=Hf+n$ will be under-constrained and therefore unsolvable. This could happen if all the points $(x',y',z')$ lie on a single line or surface instead of being sufficiently spread-out, if necessary spread-out in all three dimensions.

The total RF emission field intensity due to RF emission from all the excited spinning nuclei in the 3D volume space V is denoted by a discretely sampled vector of values $g=g(x',y',z')$. It is measurement at a discrete set of points in a 3D measurement volume space S near the target object. The 3D measurement volume space S may in general extend substantially along at least one radial direction pointing away from an approximate center of the 3D volume space V so that the measured data is non-degenerate as explained earlier. The measurement in this step is made using a plurality of RF sensitive coils (RFSCs) at different positions.

In the next step, a system matrix H of values is determined based on the theory in Section 2.2. In particular, H is determined using i. the distance and geometry between pairs of voxels (v,s) where v is a voxel in V and s is a voxel in S, and the geometry and sensor characteristics of the plurality of RFSCs, ii. the property of radiation propagation that the intensity per unit area of RF emission field decreases with the square of radial distance from the emission source and therefore facilitating the use of data values in g to determine f, and iii. a discrete vector n of values that represents the effects of noise on measurements so that measured data vector g is related to tomographic image vector f through the system matrix H and noise n by the equation g=Hf+n.

The above equation g=Hf+n is solved for the desired quantity f by a method that reduces the effect of noise n significantly. Following these steps, the desired goal of determining the tomographic image f of the target object in the 3D volume space V is achieved.

By repeating these computational steps for different V, the tomography of a larger portion of the target object can be synthesized. For example, if V corresponds to a single column of voxels, then the computations are repeated for each column in a 2D slice. Data capture itself is made for the entire 2D slice at once, but this data is Fourier transformed and the computations for different columns are carried-out separately, either in parallel or in serial mode depending on computational resources available.

In the above method, the step of solving for f can be based on any of the following possible alternatives: (i) a Singular-Value decomposition of H and spectral filtering or regularization, (ii) maximizing the probability of observing g given f, and (iii) an iterative algebraic reconstruction technique. In all of these methods, the step of solving for f can use the positivity constraint that all components of f are non-negative, i.e. zero or more.

In another embodiment of the present invention, the selected volume V is a 2D slice of the target object parallel to the X-Y plane and perpendicular to the Z-axis. This is done by first applying a constant magnetic field B along the Z-axis and then beaming an RF pulse of suitable frequency. In the next step, a gradient magnetic field Gz is applied to frequency encode different 2D slices parallel to the XY plane. Data captured by RFSCs is Fourier transformed. The magnitude of Fourier transform at different frequencies gives the desired data for different slices of 2D volume parallel to the Z-axis. In this case, data for an entire 3D volume space can be captured simultaneously. After computing the 1D Fourier transform of the captured data, computations for each 2D slice can be performed separately in parallel (or serial). This embodiment needs a large number of RFSCs, but it facilitates the capture of 3D tomography at video rate (around 10 frames/second) suitable for dynamic organs such as a beating heart.

In another embodiment of the present invention, the selected volume V is a solid 3D volume of the target object. The selection of such 3D volume V is done by applying a constant magnetic field B along the Z-axis and then beaming an RF pulse of suitable frequency to select the desired solid 3D volume V. In this case the number of RFSCs and computations needed will be very large but gradient magnetic field and computing the Fourier Transform will not be necessary.

It is clear from the description above that in the method of the present invention, the selected 3D volume can extend significantly in all three spatial dimensions (x,y,z). Alternately, the selected 3D volume can be a thin two-dimensional (2D) planar slice and the magnet must be capable of producing a magnetic field that varies in a first direction (z-axis) approximately perpendicular to the 2D planar slice (x-y plane). In another embodiment of the method, this selected 2D planar slice can be a thin one-dimensional (1D) line space or a column (along the y-axis), and in this case the apparatus must further include a second magnet that can produce a gradient or varying magnetic field along a second direction (x-axis) that is roughly perpendicular to the 1D line space and the first direction (z-axis).

In another embodiment of the method of the invention, the selected 1D line space can be a single voxel or small volume element that extends only by a small length along all three spatial dimensions (x,y,z) and the apparatus further includes a means for encoding phase of RF emissions from the target object.

8. CONCLUSION, RAMIFICATIONS AND SCOPE OF THE INVENTION

The present invention provides a novel approach based on FIT to achieve parallel and video rate MRI for heart-MRI and other rapid dynamic studies that require high time resolution. If high magnetic fields are permitted to be used on target bodies such as inanimate objects, the method of the present invention can be used for MRI with radiations other than Radio Frequencies, e.g. millimeter waves. The present invention can also be used to find the 3D tomography of the earth, moon, etc. by measuring the gravitational field in a large 3D volume space around these objects. This may be useful in mineral and oil prospecting, provided sufficiently accurate measurements can be made. The 3D volume space may have to extend both in radial and angular directions. The basic principle remains the same as that of FIT described in the present invention.

While the description here of the method, apparatus, and applications contains many specificities, these should not be construed as limitations on the scope of the invention, but rather as exemplifications of preferred embodiments thereof. Further modifications and extensions of the present invention herein disclosed will occur to persons skilled in the art to which the present invention pertains, and all such modifications are deemed to be within the scope and spirit of the present invention as defined by the appended claims and their legal equivalents thereof.

What is claimed is:

1. A Magnetic Resonance Imaging (MRI) Apparatus that comprises
    (a) A magnet that produces a magnetic field in a selected volume space in a target object whose three-dimensional (3D) tomographic image is desired,
    (b) at least one radio frequency (RF) pulse generator capable of producing an RF pulse to excite spinning atomic nuclei in said selected volume space in said target object, and
    (c) a plurality of RF sensitivity coils (RFSCs) that can measure RF radiation field intensity at a non-degenerate set of points in a 3D measurement volume space in the vicinity of said target object, wherein said 3D measurement volume space may extend substantially along at least one radial direction pointing away from an approximate center point of said target object so that RF radiation field measurements can be made at a plurality of different radial distances from said target object in addition to different angular directions with respect to said target object.

2. The apparatus of claim 1 wherein said plurality of RFSCs can be moved to different spatial positions in said 3D measurement volume space so that RF radiation field intensity can be measured in a larger 3D measurement volume space than that volume space occupied by said plurality of RFSCs.

3. The apparatus of claim 1 wherein said selected 3D volume extends significantly in all three spatial dimensions (x,y,z).

4. The apparatus of claim 1 wherein said selected 3D volume is a thin two-dimensional (2D) planar slice and said magnet is capable of producing a magnetic field that varies in a first direction approximately perpendicular to said 2D planar slice.

5. The apparatus of claim 4 wherein said selected 2D planar slice is a thin one-dimensional (1D) column or line space, and said apparatus further comprising a second magnet that produces a gradient or varying magnetic field along a second direction that is roughly perpendicular to said 1D line space and said first direction.

6. The apparatus of claim 5 wherein said selected 1D line space is a small volume element that extends only by a small length along all three spatial dimensions (x,y,z) and said apparatus further includes a means for encoding phase of RF emissions from said target object.

7. The apparatus of claim 1 wherein said magnet is an electro-magnet.

8. The apparatus of claim 2 wherein said RFSCs is a two-dimensional (2D) planar array of RF sensitivity coils.

9. The apparatus of claim 1 that further includes a Single-Photon Emission Computed Tomography (SPECT) apparatus.

10. The apparatus of claim 1 that further includes a Positron Emission Tomography (PET) apparatus.

11. A method of reconstructing a tomographic image f of a target object using a magnetic resonance imaging (MRI) apparatus, said method comprising the steps of:
  (a) selecting a three-dimensional (3D) volume space V in said target object, said 3D volume space V specified by a set of small volume elements or voxels,
  (b) introducing or beaming a magnetic field B into said 3D volume space V,
  (c) sending or beaming a pulse of Radio Frequency (RF) radiation into said 3D volume space V, said pulse RF radiation chosen to excite spinning nuclei of atoms of said target object present in said volume V to a higher energy state and causing an RF emission from excited nuclei with intensity f which characterizes the material of said target object at each voxel,
  (d) measuring a discretely sampled vector of values g of RF emission field intensity due to RF emission from excited spinning nuclei in said 3D volume space V, measurement in this step being made at a discrete set of non-degenerate points in a 3D measurement volume space S near said target object, said 3D measurement volume space S possibly extending substantially along at least one radial direction pointing away from an approximate center of said 3D volume space V, measurement in this step being made using a plurality of RF sensitive coils (RFSCs),
  (e) determining a system matrix H of values using
    i. the distance and geometry between pairs of voxels (v,s) where v is a voxel in V and s is a voxel in S, and the geometry and sensor characteristics of said plurality of RFSCs,
    ii. the property of radiation propagation that the intensity per unit area of RF emission field decreases with the square of radial distance from emission source and therefore facilitating the use of data values in g to determine f, and
    iii. a discrete vector n of values that represents the effects of noise on measurements in step (d) above, so that measured data vector g is related to tomographic image vector f through system matrix H and noise n by the equation g=Hf+n; and
  (f) solving the above equation g=Hf+n for the desired quantity f by a method that reduces the effect of noise n significantly so that the desired goal of determining the tomographic image f of said target object in said 3D volume space V is achieved.

12. The method of claim 11 wherein said method in Step (f) of solving for f is based on a Singular-Value decomposition of H and spectral filtering or regularization.

13. The method of claim 11 wherein said method in Step (f) of solving for f is based on maximizing the probability of observing g given f.

14. The method of claim 11 wherein said method in Step (f) of solving for f is based on an iterative algebraic reconstruction technique.

15. The method of claim 11 wherein said method in Step (f) of solving for f uses the positivity constraint that all components of f are non-negative, i.e. zero or more.

16. The method of claim 11 wherein said selected 3D volume extends significantly in all three spatial dimensions (x,y,z).

17. The method of claim 11 wherein said selected 3D volume is a thin two-dimensional (2D) planar slice and said MRI apparatus comprising a magnet capable of producing a magnetic field that varies in a first direction approximately perpendicular to said 2D planar slice.

18. The method of claim 17 wherein said selected 2D planar slice is a thin one-dimensional (1D) column or line space, and said MRI apparatus further comprising a second magnet that produces a gradient or varying magnetic field along a second direction that is roughly perpendicular to said 1D line space and said first direction.

19. The method of claim 18 wherein said selected 1D line space is a small volume element that extends only by a small length along all three spatial dimensions (x,y,z) and said MRI apparatus further includes a means for encoding phase of RF emissions from said target object.

20. The method of claim 11 wherein said MRI apparatus comprises a means for computing one-dimensional Fourier Transforms of time-dependent signals measured by said RF sensitive coils.

* * * * *